United States Patent
Parikh et al.

(10) Patent No.: US 9,293,458 B2
(45) Date of Patent: Mar. 22, 2016

(54) SEMICONDUCTOR ELECTRONIC COMPONENTS AND CIRCUITS

(71) Applicant: Transphorm Inc., Goleta, CA (US)

(72) Inventors: Primit Parikh, Goleta, CA (US); James Honea, Santa Barbara, CA (US); Carl C. Blake, Jr., Fountain Valley, CA (US); Robert Coffie, Camarillo, CA (US); Yifeng Wu, Goleta, CA (US); Umesh Mishra, Montecito, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/058,089

(22) Filed: Oct. 18, 2013

(65) Prior Publication Data

US 2014/0042495 A1    Feb. 13, 2014

Related U.S. Application Data

(62) Division of application No. 12/701,458, filed on Feb. 5, 2010, now Pat. No. 8,624,662.

(51) Int. Cl.
*H03K 17/687*    (2006.01)
*H01L 27/088*    (2006.01)
(Continued)

(52) U.S. Cl.
CPC ........ *H01L 27/0883* (2013.01); *H01L 21/8258* (2013.01); *H01L 23/49562* (2013.01);
(Continued)

(58) Field of Classification Search
CPC ............ H03K 17/063; H03K 17/0822; H03K 2217/0036; H03K 17/04123; H03K 17/687
USPC .......... 327/382, 427, 432, 478, 534; 257/194, 257/43, 392
See application file for complete search history.

(56) References Cited

U.S. PATENT DOCUMENTS 4,384,287 A    5/1983    Sakuma
4,728,826 A    3/1988    Einzinger et al.
(Continued)

FOREIGN PATENT DOCUMENTS

CN    101211535    7/2008
CN    101978589    2/2011
(Continued)

OTHER PUBLICATIONS

Authorized officer Keon Hyeong Kim, International Search Report and Written Opinion in PCT/US2008/076160, mailed Mar. 18, 2009, 11 pages.
(Continued)

*Primary Examiner* — Diana J Cheng
(74) *Attorney, Agent, or Firm* — Fish & Richardson P.C.

(57) ABSTRACT

An electronic component includes a high-voltage depletion-mode transistor and a low-voltage enhancement-mode transistor both encased in a single package. A source electrode of the high-voltage depletion-mode transistor is electrically connected to a drain electrode of the low-voltage enhancement-mode transistor, a drain electrode of the high-voltage depletion-mode transistor is electrically connected to a drain lead of the single package, a gate electrode of the low-voltage enhancement-mode transistor is electrically connected to a gate lead of the single package, a gate electrode of the high-voltage depletion-mode transistor is electrically connected to an additional lead of the single package, and a source electrode of the low-voltage enhancement-mode transistor is electrically connected to a conductive structural portion of the single package.

14 Claims, 12 Drawing Sheets

(51) Int. Cl.

| | | |
|---|---|---|
| *H01L 21/8258* | (2006.01) | |
| *H01L 27/06* | (2006.01) | |
| *H03K 17/567* | (2006.01) | |
| *H01L 23/495* | (2006.01) | |
| *H01L 25/16* | (2006.01) | |
| *H01L 23/64* | (2006.01) | |
| *H01L 25/18* | (2006.01) | |

(52) U.S. Cl.
CPC ........ *H01L23/49575* (2013.01); *H01L 25/165* (2013.01); *H01L 27/0605* (2013.01); *H03K 17/567* (2013.01); *H01L 23/642* (2013.01); *H01L 23/647* (2013.01); *H01L 25/18* (2013.01); *H01L 2224/48137* (2013.01); *H01L 2224/48195* (2013.01); *H01L 2224/48247* (2013.01); *H01L 2224/48257* (2013.01); *H01L 2924/1305* (2013.01); *H01L 2924/13055* (2013.01); *H01L 2924/13062* (2013.01); *H01L 2924/13091* (2013.01); *H01L 2924/30107* (2013.01)

(56) References Cited

U.S. PATENT DOCUMENTS

| | | | |
|---|---|---|---|
| 4,808,853 | A | 2/1989 | Taylor |
| 5,198,964 | A | 3/1993 | Ito et al. |
| 5,379,209 | A | 1/1995 | Goff |
| 5,493,487 | A | 2/1996 | Close et al. |
| 5,637,922 | A | 6/1997 | Fillion et al. |
| 5,952,856 | A | 9/1999 | Horiguchi et al. |
| 6,008,684 | A | 12/1999 | Ker et al. |
| 6,107,844 | A | 8/2000 | Berg et al. |
| 6,130,831 | A | 10/2000 | Matsunaga |
| 6,172,550 | B1 | 1/2001 | Gold et al. |
| 6,333,617 | B1 | 12/2001 | Itabashi et al. |
| 6,395,593 | B1 | 5/2002 | Pendharkar et al. |
| 6,521,940 | B1 | 2/2003 | Vu et al. |
| 6,633,195 | B2 * | 10/2003 | Baudelot et al. ............. 327/430 |
| 6,650,169 | B2 | 11/2003 | Faye et al. |
| 6,670,597 | B1 * | 12/2003 | Kitamura et al. ....... 250/214 AL |
| 6,781,423 | B1 | 8/2004 | Knoedgen |
| 6,900,657 | B2 | 5/2005 | Bui et al. |
| 7,116,567 | B2 | 10/2006 | Shelton et al. |
| 7,304,331 | B2 | 12/2007 | Saito et al. |
| 7,378,883 | B1 | 5/2008 | Hsueh |
| 7,443,648 | B2 | 10/2008 | Cutter et al. |
| 7,477,082 | B2 | 1/2009 | Fukazawa |
| 7,501,669 | B2 | 3/2009 | Parikh et al. |
| 7,538,366 | B2 * | 5/2009 | Saito et al. .................... 257/194 |
| 7,548,112 | B2 | 6/2009 | Sheppard |
| 7,612,602 | B2 | 11/2009 | Yang et al. |
| 7,639,064 | B2 | 12/2009 | Hsiao et al. |
| 7,719,055 | B1 | 5/2010 | McNutt et al. |
| 7,782,099 | B2 * | 8/2010 | Kawamura .................... 327/108 |
| 7,804,328 | B2 | 9/2010 | Pentakota et al. |
| 7,851,825 | B2 | 12/2010 | Suh et al. |
| 7,875,907 | B2 | 1/2011 | Honea et al. |
| 7,875,914 | B2 | 1/2011 | Sheppard |
| 7,915,643 | B2 | 3/2011 | Suh et al. |
| 7,920,013 | B2 | 4/2011 | Sachdev et al. |
| 7,965,126 | B2 | 6/2011 | Honea et al. |
| 8,013,580 | B2 | 9/2011 | Cervera et al. |
| 8,624,662 | B2 | 1/2014 | Parikh et al. |
| 2002/0125920 | A1 | 9/2002 | Stanley |
| 2003/0178654 | A1 | 9/2003 | Thornton |
| 2004/0178831 | A1 | 9/2004 | Li et al. |
| 2005/0052221 | A1 | 3/2005 | Kohnotoh et al. |
| 2005/0067716 | A1 | 3/2005 | Mishra et al. |
| 2005/0077947 | A1 | 4/2005 | Munzer et al. |
| 2005/0146310 | A1 | 7/2005 | Orr |
| 2005/0189561 | A1 | 9/2005 | Kinzer et al. |
| 2005/0189562 | A1 | 9/2005 | Kinzer et al. |
| 2005/0218964 | A1 | 10/2005 | Oswald et al. |
| 2006/0033122 | A1 | 2/2006 | Pavier |
| 2006/0043499 | A1 | 3/2006 | De Cremoux et al. |
| 2006/0060871 | A1 | 3/2006 | Beach |
| 2006/0102929 | A1 | 5/2006 | Okamoto et al. |
| 2006/0176007 | A1 | 8/2006 | Best |
| 2006/0237825 | A1 | 10/2006 | Pavier et al. |
| 2006/0238234 | A1 | 10/2006 | Benelbar et al. |
| 2006/0261473 | A1 | 11/2006 | Connah et al. |
| 2007/0018210 | A1 | 1/2007 | Sheppard |
| 2007/0080672 | A1 | 4/2007 | Yang |
| 2007/0090373 | A1 | 4/2007 | Beach et al. |
| 2007/0146045 | A1 | 6/2007 | Koyama |
| 2007/0278518 | A1 | 12/2007 | Chen et al. |
| 2008/0017998 | A1 | 1/2008 | Pavio |
| 2008/0018366 | A1 | 1/2008 | Hanna |
| 2008/0122418 | A1 | 5/2008 | Briere et al. |
| 2008/0136390 | A1 | 6/2008 | Briere |
| 2008/0158110 | A1 | 7/2008 | Lida et al. |
| 2008/0191342 | A1 | 8/2008 | Otremba |
| 2008/0203559 | A1 | 8/2008 | Lee et al. |
| 2008/0248634 | A1 | 10/2008 | Beach |
| 2008/0272404 | A1 | 11/2008 | Kapoor |
| 2008/0283844 | A1 | 11/2008 | Hoshi et al. |
| 2009/0065810 | A1 | 3/2009 | Honea et al. |
| 2009/0072269 | A1 | 3/2009 | Mishra |
| 2009/0075455 | A1 | 3/2009 | Mishra |
| 2009/0167411 | A1 | 7/2009 | Machida et al. |
| 2009/0180304 | A1 | 7/2009 | Bahramian et al. |
| 2009/0201072 | A1 | 8/2009 | Honea et al. |
| 2009/0215230 | A1 | 8/2009 | Muto et al. |
| 2009/0236728 | A1 | 9/2009 | Satou et al. |
| 2009/0267078 | A1 | 10/2009 | Mishra et al. |
| 2009/0278513 | A1 | 11/2009 | Bahramian et al. |
| 2009/0315594 | A1 | 12/2009 | Pentakota et al. |
| 2010/0067275 | A1 | 3/2010 | Wang et al. |
| 2010/0073067 | A1 | 3/2010 | Honea |
| 2010/0097119 | A1 | 4/2010 | Ma et al. |
| 2010/0117095 | A1 | 5/2010 | Zhang |
| 2010/0289067 | A1 | 11/2010 | Mishra et al. |
| 2011/0019450 | A1 | 1/2011 | Callanan et al. |
| 2011/0025397 | A1 | 2/2011 | Wang et al. |
| 2011/0121314 | A1 | 5/2011 | Suh et al. |
| 2011/0169549 | A1 | 7/2011 | Wu |
| 2011/0193619 | A1 | 8/2011 | Parikh et al. |

FOREIGN PATENT DOCUMENTS

| | | |
|---|---|---|
| EP | 2 188 842 | 5/2010 |
| EP | 2 243 213 | 10/2010 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-539712 | 12/2010 |
| JP | 2010-512119 | 4/2011 |
| TW | 200941920 | 10/2009 |
| TW | 201027912 | 7/2010 |
| TW | 201036155 | 10/2010 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Authorized officer Simin Baharlou, International Preliminary Report on Patentability in PCT/US2008/076160, mailed Mar. 25, 2010, 6 pages.

(56) References Cited

OTHER PUBLICATIONS

Authorized officer Jae Woo Wee, International Search Report and Written Opinion in PCT/US2009/033699, mailed Sep. 21, 2009, 11 pages.
Authorized officer Dorothée Mülhausen, International Preliminary Report on Patentability in PCT/US2009/033699, mailed Aug. 26, 2010, 6 pages.
Authorized officer Sung Hee Kim, International Search Report and Written Opinion in PCT/US2009/057554, mailed May 10, 2010, 13 pages.
Authorized officer Gijsbertus Beijer, International Preliminary Report on Patentability in PCT/US2009/057554, mailed Apr. 7, 2011, 7 pages.
Authorized officer Sung Chan Chung, International Search Report and Written Opinion in PCT/US2010/021824, mailed Aug. 23, 2010, 9 pages.
Authorized officer Beate Giffo-Schmitt, International Preliminary Report on Patentability in PCT/US2010/021824, mailed Aug. 3, 2010, 6 pages.
Authorized officer Bon Gyoung Goo, International Search Report and Written Opinion in PCT/US2010/055129 mailed Jul. 1, 2011, 11 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Park Kee Yong, International Search Report and Written Opinion in PCT/US2011/023485, mailed Sep. 23, 2011, 10 pages.
Authorized officer Nora Lindner, International Preliminary Report on Patentability in PCT/US2011/023485, mailed Aug. 16, 2012, 7 pages.
Authorized officer Kwak In Gu, International Search Report and Written Opinion in PCT/US2012/026810, mailed Jan. 23, 2013, 10 pages.
Chen et al, "Single-chip Boost Converter Using Monolithically Integrated AlGaN/GaN Lateral Field-effect Rectifier and Normally off HEMT," IEEE Electron Device Letters, 30(5):430-432, May 2009.
Napierala et al. (2006), "Selective GaN Epitaxy on Si(111) Substrates Using Porous Aluminum Oxide Buffer Layers," Journal of the Electrochemical Society, 153(2):G125-G127, 4 pages.
Search Report and Action in TW Application No. 098132132, issued Dec. 6, 2012, 8 pages.
Wu et al., "A 97.8% Efficient GaN HEMT Boost Converter with 300-W Output Power at 1 MHz," Aug. 2008, Electronic Device Letters, IEEE, 29(8):824-826.
Notification of First Office Action in CN Application No. 201180009225.8, mailed Sep. 25, 2014, 11 pages.

* cited by examiner

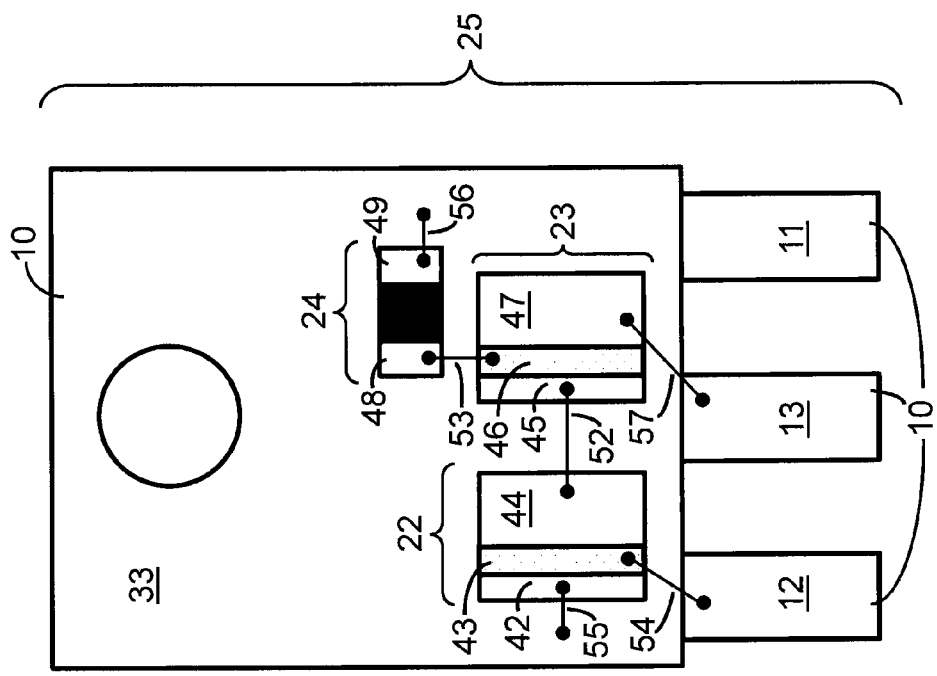

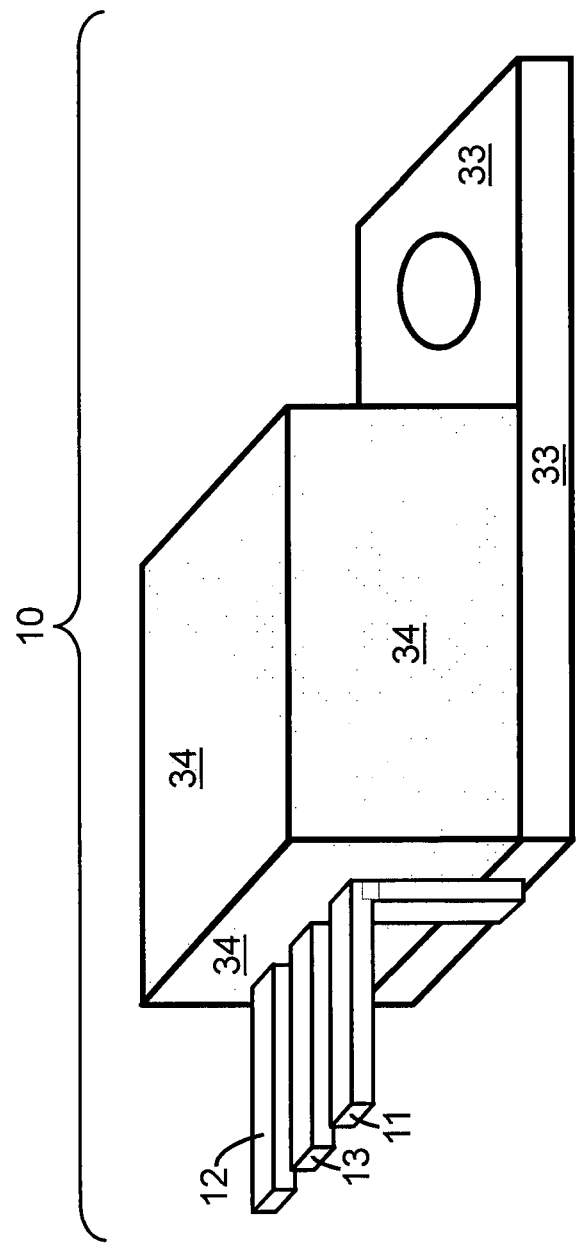

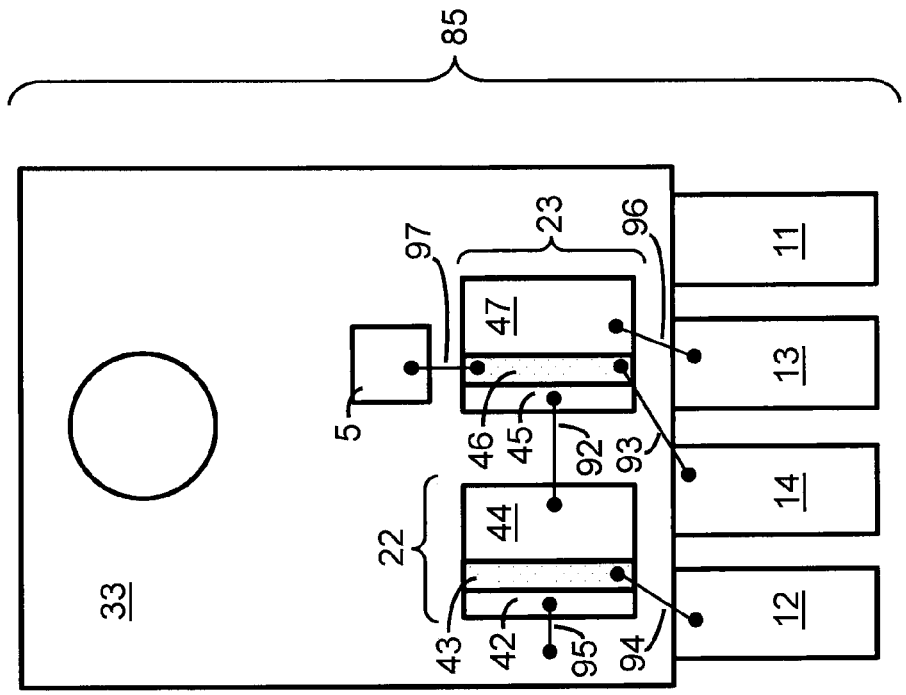
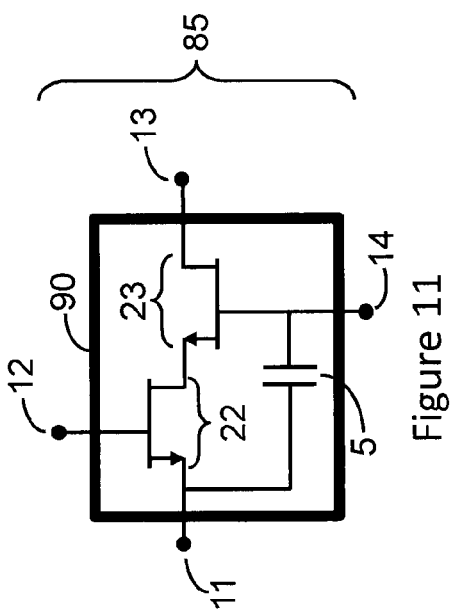
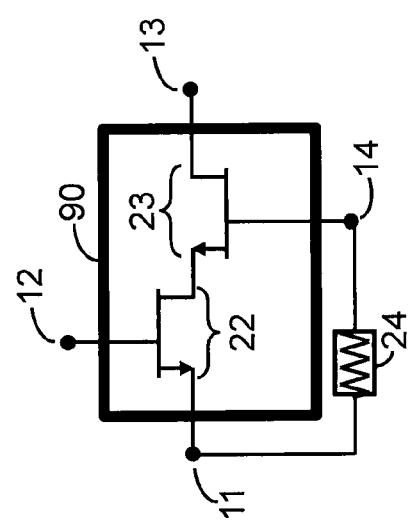

ly low switching speeds and high levels of electrical noise. More recently, silicon carbide (SiC) power devices have been considered due to their superior properties. III-N semiconductor devices, such as gallium nitride (GaN) devices, are now emerging as attractive candidates to carry large currents, support high voltages and to provide very low on-resistance and fast switching times.

SEMICONDUCTOR ELECTRONIC COMPONENTS AND CIRCUITS

TECHNICAL FIELD

Semiconductor electronic devices and components, and a variety of circuit applications in which the devices and components may be utilized are described.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relative Most conventional III-N high electron mobility transistors (HEMTs) and related transistor devices are normally on, i.e., have a negative threshold voltage, which means that they can conduct current at zero gate voltage. These devices with negative threshold voltages are known as depletion-mode (D-mode) devices. It is preferable in power electronics to have normally off devices, i.e., devices with positive threshold voltages, that cannot conduct current at zero gate voltage, in order to avoid damage to the device or to other circuit components by preventing accidental turn on of the device. Normally off devices are commonly referred to as enhancement-mode (E-mode) devices.

Reliable fabrication and manufacturing of high-voltage III-N E-mode devices has thus far proven to be very difficult. One alternative to a single high-voltage E-mode device is to combine a high-voltage D-mode device with a low-voltage E-mode device in the configuration of FIG. 1 to form a hybrid device, which in many cases achieves the same or similar output characteristics as a single high-voltage E-mode device, shown in FIG. 2. The hybrid device of FIG. 1 includes a high-voltage D-mode transistor 23 and a low-voltage E-mode transistor 22 both encased in a package 10, the package including a source lead 11, a gate lead 12, and a drain lead 13. The source electrode of the low-voltage E-mode transistor 22 and the gate electrode of the high-voltage D-mode transistor 23 are both electrically connected to the source lead 11. The gate electrode of the low-voltage E-mode transistor 22 is electrically connected to the gate lead 12. The drain electrode of the high-voltage D-mode transistor 23 is electrically connected to the drain lead 13. The source electrode of the high-voltage D-mode transistor 23 is electrically connected to the drain electrode of the low-voltage E-mode transistor 22.

The device of FIG. 2 includes a single high-voltage E-mode transistor 21 encased in the same or a similar package to the hybrid device of FIG. 1. The source electrode of the high-voltage E-mode transistor 21 is connected to the source lead 11, the gate electrode of the high-voltage E-mode transistor 21 is connected to the gate lead 12, and the drain electrode of the high-voltage E-mode transistor 21 is connected to the drain lead 13. Both of the devices in FIGS. 1 and 2 are capable of blocking high voltages between the source lead 11 and drain lead 13 when 0V is applied to the gate lead 12 relative to the source lead 11, and both devices can conduct current from the source lead 11 to the drain lead 13 when a sufficiently positive voltage is applied to the gate lead 12 relative to the source lead 11. While there are many conventional applications in which the hybrid device of FIG. 1 can be used in place of the single high-voltage E-mode device of FIG. 2, there are certain applications in which modifications and/or improvements to the structure of the hybrid device are necessary in order to achieve the desired output.

SUMMARY

In one aspect, an electronic component is described. The component includes a high-voltage depletion-mode transistor, a low-voltage enhancement-mode transistor and a single package enclosing both the high-voltage depletion-mode transistor and the low-voltage enhancement-mode transistor. A source electrode of the high-voltage depletion-mode transistor is electrically connected to a drain electrode of the low-voltage enhancement-mode transistor, a drain electrode of the high-voltage depletion-mode transistor is electrically connected to a drain lead of the single package, a gate electrode of the low-voltage enhancement-mode transistor is electrically connected to a gate lead of the single package, a gate electrode of the high-voltage depletion-mode transistor is electrically connected to an additional lead of the single package, and a source electrode of the low-voltage enhancement-mode transistor is electrically connected to a conductive structural portion of the single package.

In another aspect, an electronic component is described that includes a high-voltage depletion-mode transistor, a low-voltage enhancement-mode transistor, a resistor, and a single package enclosing the high-voltage depletion-mode transistor, the low-voltage enhancement-mode transistor, and the resistor. A source electrode of the high-voltage depletion-mode transistor is electrically connected to a drain electrode of the low-voltage enhancement-mode transistor, a drain electrode of the high-voltage depletion-mode transistor is electrically connected to a drain lead of the single package, a gate electrode of the low-voltage enhancement-mode transistor is electrically connected to a gate lead of the single package, a source electrode of the low-voltage enhancement-mode transistor is electrically connected to a conductive structural portion of the single package, a first end of the resistor is electrically connected to a gate electrode of the high-voltage depletion-mode transistor, and a second end of the resistor is electrically connected to a conductive structural portion of the single package.

In yet another aspect, an electronic component is described that includes a high-voltage depletion-mode transistor, a low-voltage enhancement-mode transistor, and a single package enclosing both the high-voltage depletion-mode transistor and the low-voltage enhancement-mode transistor. A source electrode of the high-voltage depletion-mode transistor is electrically connected to a drain electrode of the low-voltage enhancement-mode transistor, a drain electrode of the high-voltage depletion-mode transistor is electrically connected to a drain lead of the single package, a gate electrode of the low-voltage enhancement-mode transistor is electrically connected to a gate lead of the single package, a gate electrode of the high-voltage depletion-mode transistor is electrically connected to an additional lead of the single package, and a source electrode of the low-voltage enhancement-mode transistor is electrically connected to a source lead of the single package.

Implementations of the devices and methods described herein may include one or more of the following features. The gate electrode of the high-voltage depletion-mode transistor may not be electrically connected to any electrodes of any of the transistors enclosed in the single package. The single package can further comprise a source lead. The source lead can be electrically connected to the conductive structural portion of the single package. The short-circuit survivability of the electronic component can be at least 10 microseconds when a voltage of the gate lead relative to a voltage of the source lead of the single package is greater than a threshold voltage of the electronic component, a high voltage is applied to the drain lead relative to the source lead of the single package, and a voltage of the gate electrode of the high-voltage depletion-mode transistor is less than the voltage of the source lead of the single package. The high voltage can be at least about 300V. The voltage of the additional lead can be at least about 1V less than the voltage of the source lead of the single package. A maximum current that can flow through the electronic component may be smaller when a voltage of the additional lead is less than a voltage of the source lead as compared to when the voltage of the additional lead is equal to the voltage of the source lead. The device can include a capacitor, wherein a first end of the capacitor is electrically connected to the gate electrode of the high-voltage depletion-mode transistor, and a second end of the capacitor is electrically connected to the source electrode of the low-voltage enhancement-mode transistor. The single package can enclose the capacitor. The high-voltage depletion-mode transistor can be a III-Nitride transistor. The low-voltage enhancement-mode transistor can be a silicon-based transistor or a III-Nitride transistor. The device can include resistor, wherein a first end of the resistor is electrically connected to the additional lead of the single package, and a second end of the resistor is electrically connected to the conductive structural portion of the single package. The single package can further comprise a source lead that is electrically connected to the conductive structural portion of the single package, and the second end of the resistor is directly connected to the source lead. The resistor can be external to the single package. A short-circuit survivability of the electronic component can be at least 10 microseconds when a voltage of the gate lead relative to a voltage of the conductive structural portion of the single package is greater than a threshold voltage of the electronic component, a high voltage is applied to the drain lead relative to the conductive structural portion of the single package, and a voltage of the additional lead is less than the voltage of the conductive structural portion of the single package. The voltage of the additional lead can be at least about 1V less than the voltage of the conductive structural portion of the single package. A maximum current that can flow through the electronic component can be smaller when a voltage of the additional lead is less than a voltage of the conductive structural portion of the single package as compared to when the voltage of the additional lead is equal to the voltage of the conductive structural portion of the single package. The positive voltage can be at least about 300V. The voltage applied to the additional lead is at least about 1V less than the voltage of the conductive structural portion of the single package. Methods can include at a second time switching the voltage of the gate lead relative to the conductive structural portion of the single package to a value that is greater than the threshold voltage of the electronic component, allowing a current to flow through the electronic component. The single package can further comprise a source lead, and the source lead is electrically connected to the conductive structural portion of the single package. Electrically connecting the source electrode of the low-voltage enhancement-mode transistor to the conductive structural portion of the single package can comprise electrically connecting the source electrode of the low-voltage enhancement-mode transistor to the source lead of the single package. The high-voltage depletion-mode transistor and the resistor can be on a common substrate. The high-voltage depletion-mode transistor and the resistor can comprise a same semiconductor layer structure. The high-voltage depletion-mode transistor and the resistor can comprise III-N semiconductor materials. The high-voltage depletion-mode transistor can comprise a semiconductor layer structure, and the resistor can comprise a conducting or semiconducting layer which is on the semiconductor layer structure. The resistor can have a resistance of between about 100 Ohms and 100 kOhms. A short-circuit survivability of the electronic component can be at least 10 microseconds when a voltage of the gate lead relative to a voltage of the source lead of the single package is greater than a threshold voltage of the electronic component, a high voltage is applied to the drain lead relative to the source lead of the single package, and a voltage of the gate electrode of the high-voltage depletion-mode transistor is less than the voltage of the source lead of the single package. The voltage of the additional lead can be at least about 1V less than the voltage of the source lead of the single package. A maximum current that can flow through the electronic component can be smaller when a voltage of the additional lead is less than a voltage of the source lead as compared to when the voltage of the additional lead is equal to the voltage of the source lead.

Advantages of the electronic components described herein, and the methods for operating the electronic components, can include one or more of the following. The slew rate of the electronic components can be limited, which may result in lower electromagnetic interference (EMI) during or immediately after switching, as well as preventing malfunction of the gate drive circuit that may be connected to the components. The maximum current that may flow through the electronic components can be limited, which can prevent damage to the electronic components in case of failure of the external circuit, such as by increasing the short-circuit survivability of the electronic components.

DESCRIPTION OF DRAWINGS

FIG. 4 is an exposed plan view of the electronic component of FIG. 3.

FIGS. 5 and 6 are perspective views of the electronic component of FIG. 3.

FIGS. 11 and 12 are schematic diagrams of electronic components.

FIG. 13 is an exposed plan view of the electronic component of FIG. 11.

DETAILED DESCRIPTION

Figure 2:
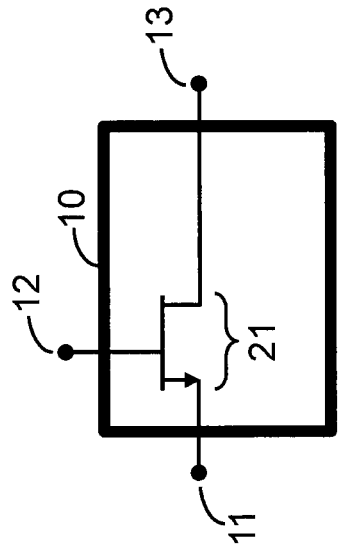
FIGS. 1 and 2 are schematic diagrams of electronic components of the prior art.

Described herein are packaged hybrid enhancement-mode electronic components which include a high-voltage depletion-mode transistor and a low-voltage enhancement mode transistor, both of which are encased or encapsulated in a single package. The electronic components furthermore either include an integrated resistor connected to the gate electrode of the depletion-mode transistor, as in FIG. 3, or are configured so that the gate electrode of the depletion-mode transistor is electrically connected to a lead of the single package but is not electrically connected to any of the other electrodes of either transistor, as in FIG. 11. For electronic components with an integrated resistor, the resistor can limit the slew rate immediately after the input voltage of the electronic component is switched, which can result in less generation of electrical noise or electromagnetic interference (EMI), as well as preventing malfunction of the gate drive circuit. For electronic components in which the gate electrode of the depletion-mode transistor is electrically connected to a lead of the single package but is not electrically connected to any of the other electrodes of either transistor (i.e., the electronic component of FIG. 11), a resistor can optionally be externally connected (i.e., external to the single package, such that the resistor is not contained within the case of the single package) to the gate electrode of the depletion-mode transistor to achieve the same benefits as that for electronic components with an integrated resistor, and additionally allow for user selection of the value of the gate resistance in order to optimize circuit performance. Furthermore, the electronic component of FIG. 11 can be configured as a current limiter in order to limit the current that can flow in case of failure of the external circuit, thereby preventing large currents that may further damage the circuit or other external components. These electronic components and their applications are further described below.

As used herein, two or more contacts or other items such as conductive layers or components are said to be "electrically connected" if they are connected by a material which is sufficiently conducting to ensure that the electric potential at each of the contacts or other items is intended to be the same, i.e., is about the same, at all times under any bias conditions. As used herein, a "hybrid enhancement-mode electronic device or component" is an electronic device or component formed of a high-voltage depletion-mode transistor and a low-voltage enhancement-mode transistor configured such that the component can operate similarly to a single high-voltage enhancement-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage applied to the third node (drain node) relative to the source node. When the gate node is held at a sufficiently positive voltage relative to the source node, current passes from the source node to the drain node or from the drain node to the source node when a sufficiently large positive voltage is applied to the drain node relative to the source node. As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor contained within the circuit in which the low-voltage device is used. In other implementations, $V_{low}$ is about 10V, about 20V, about 30V, about 40V, or between about 5V and 50V, such as between about 10V and 30V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

Figure 1:
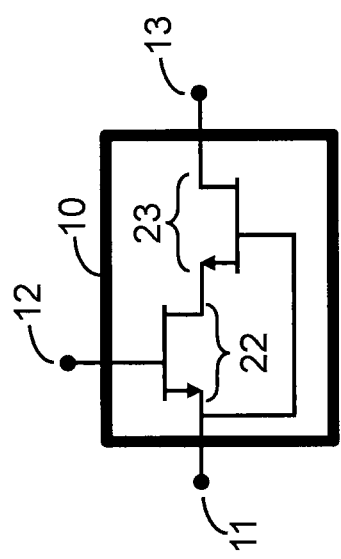

One difference between the devices of FIGS. 1 and 2 is that every transistor electrode in the E-mode device of FIG. 2 is accessible to an end user, whereas there are several electrodes in the hybrid device that are inaccessible. For example, a user could directly apply any voltage or connect an external component to any of the electrodes of the high-voltage E-mode transistor 21 of FIG. 2 by applying the desired voltage or connecting the external component to the associated package lead. For the hybrid device of FIG. 1, a user could directly apply any voltage or connect an external component to the source and gate electrodes of the low-voltage E-mode transistor 22 and to the gate and drain electrodes of the high-voltage D-mode transistor 23, but not to the drain electrode of the low-voltage E-mode transistor 22 or to the source electrode of the high-voltage D-mode transistor 23. Furthermore, the voltage applied to the gate electrode of the high-voltage D-mode transistor 23 is limited to always being the same as the voltage applied to the source electrode of the low-voltage E-mode transistor 22, since these two electrodes are both electrically connected to the same package lead. Similarly, any external component connected to the gate electrode of the high-voltage D-mode transistor 23 would also be connected to the source electrode of the low-voltage E-mode transistor 22.

In many circuits, one or more high-voltage E-mode transistors such as that of FIG. 2 will have their gate electrodes driven by an external gate-drive circuit. That is, an output node of the gate-drive circuit is electrically connected to the gate electrode or gate lead 12 of the high-voltage E-mode transistor and applies voltage signals to the gate. For many applications, it is desirable to insert a resistor (i.e., a gate resistor) electrically between the gate electrode of the E-mode transistor and the output node of the gate-drive circuit. That is, instead of connecting the output node of the gate drive-circuit directly to gate lead 12 of the E-mode transistor, one end of a gate resistor is electrically connected to the gate lead 12 of the E-mode transistor, and the output node of the gate-drive circuit is connected to the opposite end of the gate resistor. A single E-mode transistor such as that of FIG. 2 typically has a substantial input-to-output capacitance (i.e., Miller capacitance) between the gate and drain electrodes, which in the absence of a gate resistor leads to large transient gate currents and large transient drain voltage gradients (i.e., high slew rates) immediately after the transistor is switched. The large transient gate currents and/or large transient drain voltage gradients can damage or interfere with the gate drive circuit, and the high slew rates can additionally cause intolerably high levels of EMI. Adding a gate resistor to the charge/discharge path of the Miller capacitance in the E-mode transistor of FIG. 2, as described above, can limit the slew rate and reduce transient gate currents during operation.

If a hybrid enhancement-mode electronic device, such as that of FIG. 1, is used in place of the E-mode transistor of FIG. 2, the Miller capacitance between the input and output, which for this device is the capacitance between the gate electrode of the low-voltage E-mode transistor 22 and the drain electrode of the high-voltage D-mode transistor 23, is typically not substantially large. Hence, connecting a gate resistor between the input of the hybrid enhancement-mode electronic device (i.e., the gate electrode of the low-voltage E-mode transistor 22) and the node driving the input may not substantially affect the slew rate. However, a substantial capacitance does exist between the gate and drain electrodes of the high-voltage D-mode transistor 23. Hence, inserting a gate resistor electrically between the gate electrode of the high-voltage D-mode transistor 23 and the source electrode of the low-voltage E-mode transistor 22 would achieve the desired effect of reducing the slew rate. However, the hybrid enhancement-mode electronic device of FIG. 1 does not include means by which a gate resistor could be connected in this way.

Figure 3:
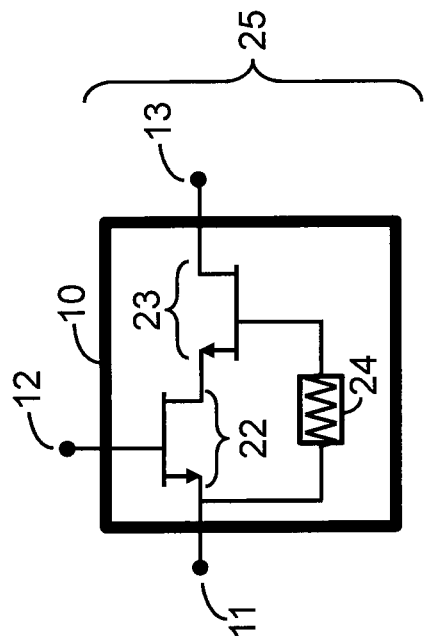
FIG. 3 is a schematic diagram of an electronic component.

FIG. 3 is a schematic diagram of an electronic component 25 which includes a high-voltage depletion-mode transistor 23, a low-voltage enhancement-mode transistor 22, and a resistor 24, all encased, enclosed, or encapsulated in a single package 10. The electronic component 25 includes a hybrid enhancement-mode electronic device with a gate resistor, all encased, enclosed, or encapsulated in a single package. An exposed plan view of the electronic component 25, shown in FIG. 4, illustrates portions of the single package 10 along with the electronic devices which are encased, enclosed, or encapsulated within the single package 10. A perspective view of the single package 10 is shown in FIG. 5, and an alternative single package 10' that can be used in place of single package 10 is shown in FIG. 6.

The single package 10, illustrated in detail in FIG. 5, includes encapsulating structural portions, such as a case 34 and a package base 33, as well as non-structural portions, such as leads 11-13. As used herein, "structural portions" of a package are portions which form the basic shape or molding of the package and provide the structural rigidity of the package necessary to protect the enclosed devices. In many cases, when an electronic component which includes a package is used in a discrete circuit, a structural portion of the package is directly mounted to the circuit or circuit board. In the single package 10 of FIG. 5, the package base 33 is formed of an electrically conducting material, i.e., the package base 33 is an electrically conductive structural portion of the package, and the case 34 is formed of an insulating material. The single package includes three leads, a gate lead 12, a drain lead 13, and a source lead 11. In some implementations, the source lead 11 is omitted. The leads 11-13 are each formed of an electrically conducting material. The source lead 11, when included, can be either electrically connected to the package base 33, as illustrated in FIG. 5, or can alternatively be electrically isolated from the package base 33. The gate and drain leads 12 and 13, respectively, are electrically isolated from the package base 33.

As used herein, a "single package" is a package containing, enclosing, encapsulating, or encasing one or more electronic devices or components. A single package includes structural portions, such as the package base 33 and case 34 in FIG. 5, which completely surround the enclosed devices or components. A single package also includes conducting leads which are at least partially on an opposite side of the structural portion material from the enclosed electronic devices or components, the leads being electrically connected to some or all of the enclosed electronic devices or components. Thus, a user wanting to connect an external device or circuit component to one of the electrodes of the enclosed devices or components can connect the external device or circuit component to the package lead which is connected to the desired electrode of the enclosed device. In some implementations, the enclosed or encapsulated devices or components are not each individually encased or encapsulated in a package separate from one another. That is, a single package can have a perimeter within which the one or more electronic devices are located and there is no packaging separating or in the space between one of the electronic devices and another of the electronic devices within the single package. The structural portions of the single package, such as the package base 33 and case 34 in FIG. 5, can form a single cavity in which the electronic devices or components are enclosed. In some implementations, the electronic devices or components contained in the package can be supported by the package base 33, and a single case 34 can be molded around the enclosed electronic devices or components, such that the single package does not contain any cavity or cavities (i.e., the single package is free of any cavity or cavities), and the case material contacts the enclosed electronic devices or components. The footprint of the case 34, i.e., the area of the case as measured parallel to a main surface of the package base 33, may be less than 900 square millimeters, less than 400 square millimeters, or less than 100 square millimeters. The enclosed electronic devices or components can be supported by the package base 33. In some implementations, there is no package base material or case material between any of the electronic devices, i.e., if there is a cavity formed by the case 34 the cavity is a continuous cavity. The connections between the various electronic devices or components enclosed in the single package can be wire bonds or can be formed by wire bonding. In some implementations, one or more of the enclosed electronic devices or components are formed on a common substrate or share a common material layer, in which case connections between electrodes can be lithographically defined. In some implementations, connections between various enclosed electronic devices or components to one another, or to portions of the package, are not formed by circuit traces on a circuit board. That is, the interior of the cavity in the single package can be free of circuit traces, i.e., conductive trace lines that are deposited on a circuit board. A single package has mechanical integrity without inclusion of any additional casing.

Figure 6:
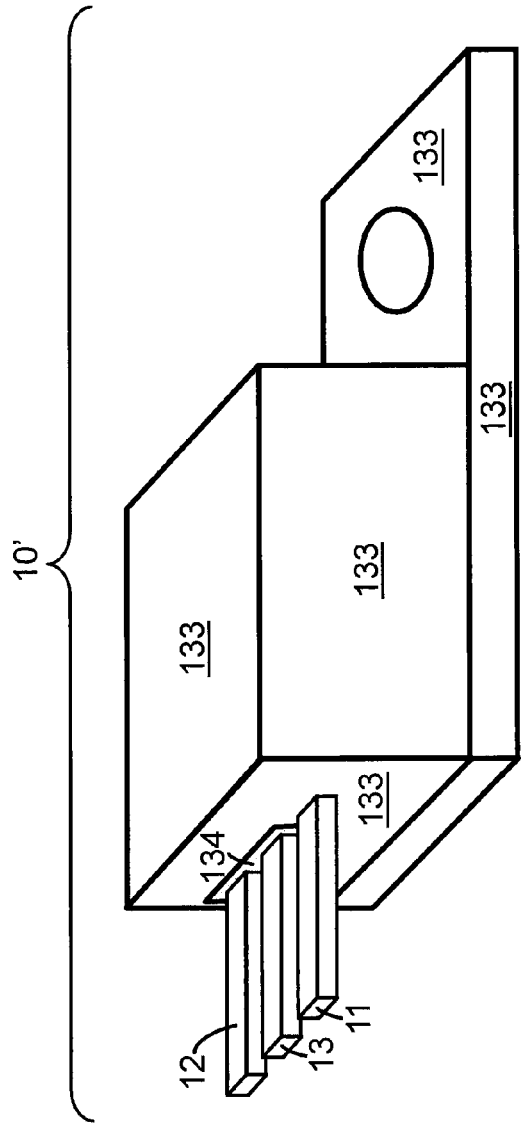

FIG. 6 shows an alternative single package 10' that can be used in place of single package 10 from FIG. 5. The single package 10' in FIG. 6 is similar to single package 10 in FIG. 5, except that the package base 33 and case 34 in FIG. 5 are replaced by a conducting case 133, i.e., an electrically conductive structural portion, which completely surrounds the enclosed devices. In the single package 10' of FIG. 6, the source lead 11, when included, is either electrically connected to the conducting case 133, as shown in FIG. 6, or can alternatively be electrically isolated from the conducting case 133. The gate and drain leads 12 and 13, respectively, are both electrically isolated from the conducting case 133 by electrically insulating material 134.

The high-voltage depletion-mode transistor 23 can be a field-effect transistor (FET), such as a high-electron mobility transistor (HEMT), a heterojunction field-effect transistor (HFET), a JFET, a MESFET, a CAVET, or any other FET structure suitable for power switching applications. In some implementations, the high-voltage depletion-mode transistor 23 is a III-Nitride or III-N transistor, such as a III-N FET, a III-N HEMT, a III-N HFET, a III-N POLFET, a III-N JFET, a III-N MESFET, a III-N CAVET, or any other III-N structure suitable for power switching applications. When a III-N transistor is used, it may be a III-face device (i.e., electrodes are formed on a group III face of the III-N layers) or a N-face device (i.e., electrodes are formed on an N face of the III-N layers). As used herein, the terms III-Nitride or III-N materials, layers, devices, structures, etc., refer to a material, device, or structure comprised of a compound semiconductor material according to the stoichiometric formula $Al_xIn_yGa_zN$, where x+y+z is about 1.

Figure 7:
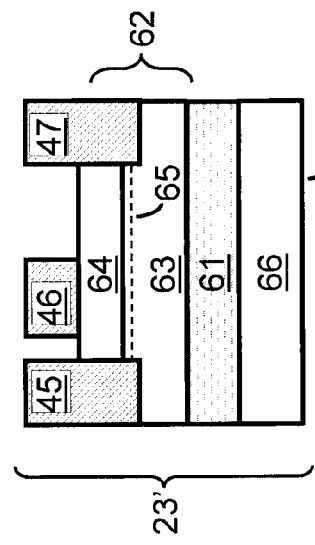
FIG. 7 is a schematic cross-sectional view of a III-N HEMT device.

When a III-N transistor is used for high-voltage depletion-mode transistor 23, the III-N transistor can be a lateral device with an insulating or semi-insulating portion on an opposite side of the semiconductor body from all of the electrodes, such as the III-N HEMT 23' illustrated in FIG. 7. In some implementations, a semi-insulating layer is formed by doping a semiconductor layer to render the layer electrically insulating, although not as insulating as some insulating materials. The III-N HEMT 23' of FIG. 7 includes an insulating or semi-insulating portion 61, a semiconductor body 62 which includes a III-N buffer layer 63, such as a layer of GaN, and a III-N barrier layer 64, such as a layer of AlGaN, a two-dimensional electron gas (2DEG) channel 65, a source electrode 45, a gate electrode 46, and a drain electrode 47. The III-N HEMT can optionally include a conducting or semi-conducting portion 66, such as a silicon substrate on an opposite side of insulating or semi-insulating portion 61 from the semiconductor body 62.

In some implementations, conducting or semi-conducting portion 66 is not included, and the insulating or semi-insulating portion 61 is an insulating or semi-insulating substrate or carrier wafer. In other implementations, conducting or semi-conducting portion 66 is included and is a silicon substrate or an electrically conducting carrier wafer, and the insulating or semi-insulating portion 61 is an insulating or semi-insulating III-N layer. As used herein, a "substrate" is a material layer on top of which semiconductor material layers of a semiconductor device are epitaxially grown such that the crystalline structure of the portion of semiconductor material contacting or adjacent to the substrate at least partially conforms to or is at least partially determined by the crystalline structure of the substrate. In some implementations, the substrate does not contribute to any conduction of current through the semiconductor device. Having the III-N transistor be a lateral device with an insulating or semi-insulating portion on an opposite side of the semiconductor body 62 from all of the electrodes can be advantageous. When mounting the III-N transistor inside the package, the surface of the device on a side opposite the electrodes, i.e., surface 68, can be mounted directly to the package base 33 without requiring an insulating spacer, such as a "shim", between the III-N transistor and the package base 33. For example, when conducting or semi-conducting portion 66 is not included, the insulating or semi-insulating portion 61 can be mounted directly to the package base 33 without requiring an insulating spacer between the III-N transistor and the package base 33, and when conducting or semi-conducting portion 66 is included, the conducting or semi-conducting portion 66 can be mounted directly to the package base 33 without requiring an insulating spacer between the III-N transistor and the package base 33. Transistors which are currently used in conventional power switching circuits, for example Si CoolMOS transistors, are typically vertical devices with electrodes on both sides of the semiconductor body, and therefore may require an insulating spacer between the transistor and the package base, which can result in poorer dissipation of heat generated during operation of the transistor and in some cases can result in more EMI produced during circuit operation.

A III-N transistor used for high-voltage depletion-mode transistor 23 may also include additional features for power switching applications. These can include, but are not limited to, insulating layers between the gate and the semiconductor body, surface passivation layers, field plates, recesses in the semiconductor body beneath the gate, and additional semiconductor layers, such as an AlN layer between the III-N buffer layer 63 and the III-N barrier layer 64, or a III-N back-barrier layer between the 2DEG 65 and the insulating or semi-insulating portion 61 or between the 2DEG 65 and the conducting or semi-conducting portion 66.

Referring back to FIGS. 3 and 4, the low-voltage enhancement-mode transistor 22 has a positive threshold voltage $V_{th}$, such as about 1V or higher, about 1.5V or higher, or about 2V or higher. The low-voltage enhancement-mode transistor 22 can block any voltage between 0V and at least $|V_{th}|$, where $|V_{th}|$ is the magnitude (absolute value) of the threshold voltage of the high-voltage depletion-mode transistor 23. Typical III-N depletion-mode transistor threshold voltages $V_{th}$ for high-voltage devices are about −5 to −10V (depletion-mode=negative $V_{th}$). Hence, when a III-N transistor is used for high-voltage depletion-mode transistor 23, the low-voltage enhancement-mode transistor 22 may be capable of blocking any voltage between 0V and at least 5V, 0V and at least 10V, or 0V and at least 20V. In some implementations, the low-voltage enhancement-mode transistor 22 can block any voltage between 0V and at least about $2*|V_{th}|$. The low-voltage enhancement-mode transistor 22 is hence a low-voltage device, as the voltages that it must be capable of blocking are substantially less than the circuit high voltage. In some implementations, the low-voltage enhancement-mode transistor 22 is a Si MOS transistor, while in other implementations it is a III-N transistor, such as a III-N HEMT. In yet other implementations, the low-voltage enhancement-mode transistor 22 is a nitrogen-face or N-face III-N transistor.

The resistance value of the resistor 24 in part determines the maximum slew rate of the circuit. For a given circuit, a larger resistance value R for resistor 24 results in a lower maximum slew rate. In most cases, the resistance R multiplied by the gate capacitance of the high-voltage depletion-mode transistor 23 is proportional to the maximum slew rate. In some implementations, the resistor value is between about 100 Ohms and 100 kOhms.

The electronic devices encased or enclosed within the single package 10 in the electronic component 25 are mounted inside the single package and connected as follows. Referring to FIG. 4, electrical connectors 52-57, which can be single or multiple wire bonds, are used to electrically connect portions of the single package 10, the low-voltage enhancement-mode (E-mode) transistor 22, the high-voltage depletion-mode (D-mode) transistor 23, and the resistor 24 to one another. When III-N transistors with semi-insulating substrates are used for either or both the low-voltage E-mode transistor 22 or the high-voltage D-mode transistor 23, the low-voltage E-mode transistor 22 and/or the high-voltage D-mode transistor 23 can be mounted inside the package with their respective insulating or semi-insulating substrates in contact with the package base 23. The source electrode 42 of the low-voltage E-mode transistor 22 is electrically connected to a conductive structural portion of the package such as the package base 33, for example by conductive connector 55, or can alternatively be electrically connected to source lead 11 of the package. The gate electrode 43 of the low-voltage E-mode transistor 22 is electrically connected to the gate lead 12 of the package, such as by conductive connector 54. The drain electrode 44 of the low-voltage E-mode transistor 22 is electrically connected to the source electrode 45 of the high-voltage D-mode transistor 23, such as by conductive connector 52. The drain electrode 47 of the high-voltage D-mode transistor 23 is electrically connected to drain lead 13 of the package, such as by conductive connector 57. The gate electrode 46 of the high-voltage D-mode transistor 23 is electrically connected to a first end 48 of the resistor 24, such as by conductive connector 53. A second end 49 of the resistor 24 is electrically connected to a conductive structural portion of the package such as the package base 33, for example by conductive connector 56, or can alternatively be electrically connected to source lead 11 of the package.

Figure 8:
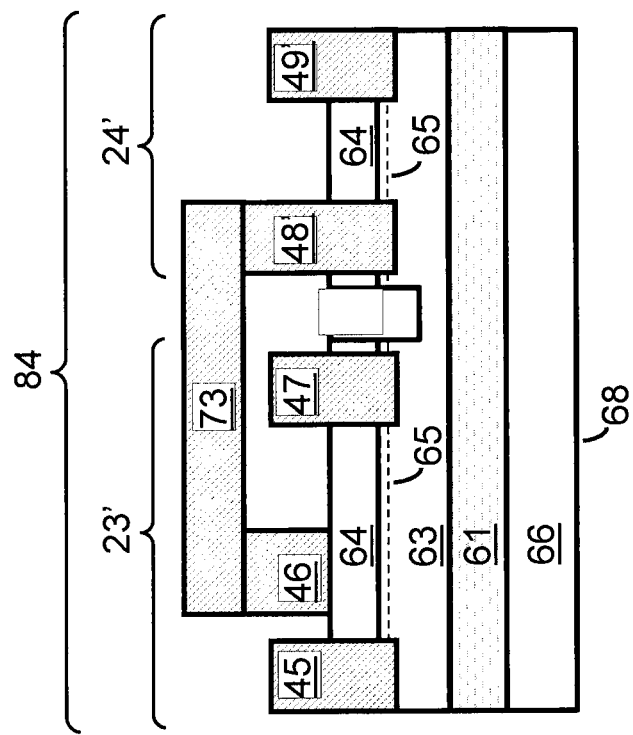

In some implementations, the high-voltage depletion-mode transistor 23 and the resistor 24 are both formed of the same semiconductor materials and/or can share or be formed on a common substrate. For example, FIG. 8 shows a single component 84 which includes the III-N HEMT 23' of FIG. 7 and a resistor 24', both formed of the same III-N materials and sharing or formed on a common substrate. The resistor includes electrodes 48' and 49' which form ohmic contacts to the 2DEG 65 in the III-N materials. Electrode 48' is electrically connected to the gate electrode 46 of the III-N HEMT 23', for example by an interconnect 73.

Figure 9:
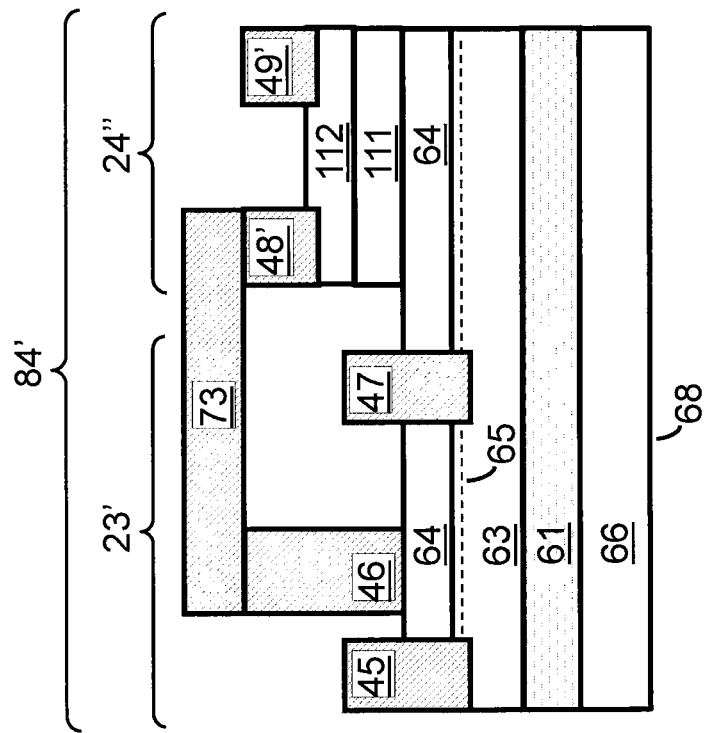
FIGS. 8 and 9 are schematic cross-sectional views of the III-N HEMT device of FIG. 7 connected to a resistor.
Figure 10:
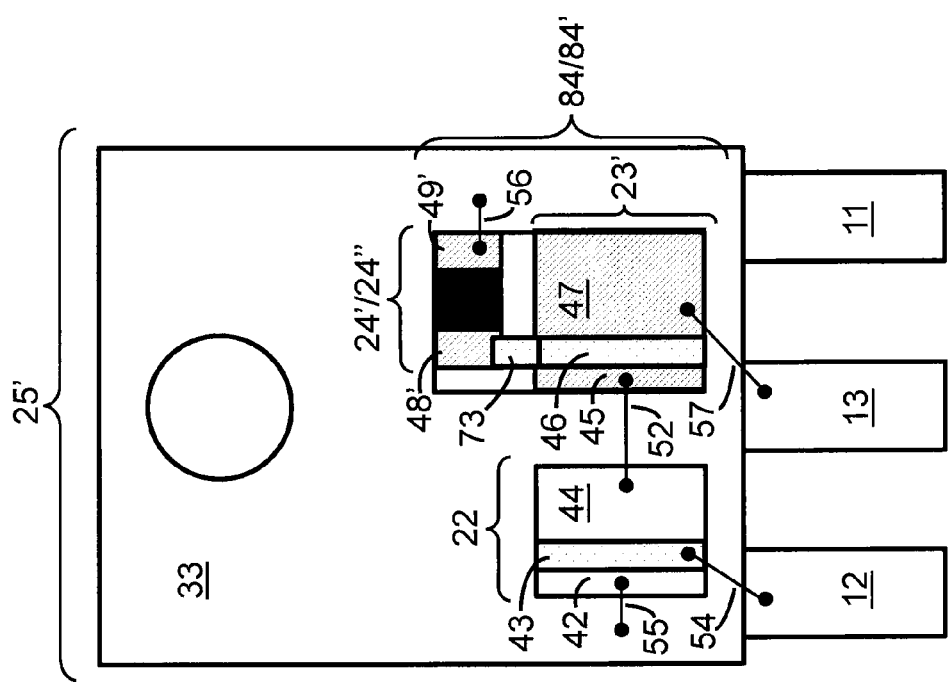
FIG. 10 is an exposed plan view of an electronic component.

In some implementations, the high-voltage depletion-mode transistor 23 and the resistor 24 both share or are formed on a common substrate, but are formed of different materials or material layers. For example, FIG. 9 shows a single component 84' which includes the III-N HEMT 23' of FIG. 7 and a resistor 24''. The resistor 24'' is formed of a conducting or semiconducting layer 112 which can be deposited on the III-N material layers that are used to form III-N HEMT 23'. The resistor includes electrodes 48' and 49' which form ohmic contacts to the conducting or semiconducting layer 112. An insulating or semi-insulating material 111 can optionally be included between the conducting or semiconducting layer 112 and the III-N material layers. FIG. 10 shows an exposed plan view of an electronic component 25' which is the same as electronic component 25 of FIG. 4, except that the high-voltage depletion-transistor and the resistor are integrated into a single component, as in FIGS. 8 and 9. Integrating the high-voltage depletion-transistor and the resistor into a single component can simplify packaging and reduce costs.

Figure 14:
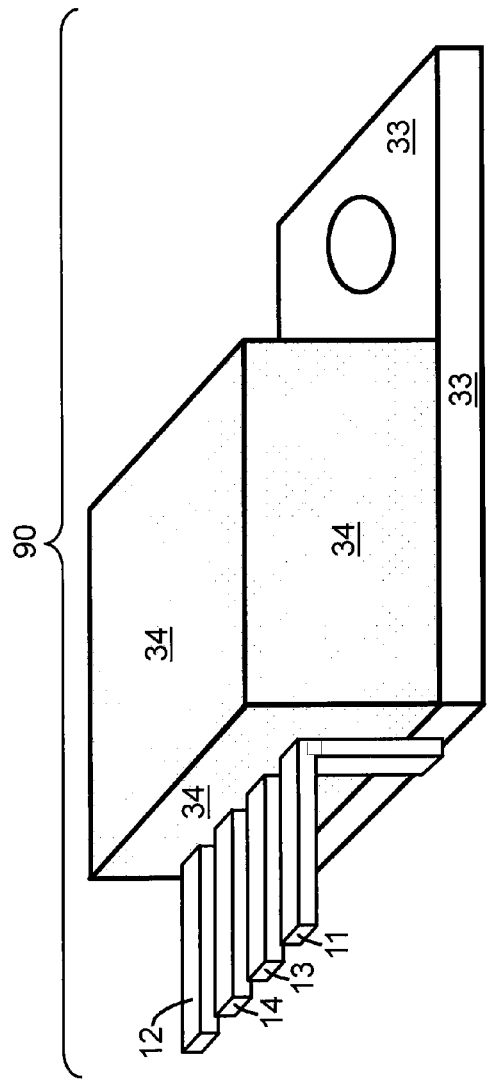
FIG. 14 is a perspective view of the electronic component of FIG. 11.

In other implementations, illustrated in FIGS. 11-14, an electronic component 85 includes a high-voltage depletion-mode transistor 23 and a low-voltage enhancement-mode transistor 22 both encased, enclosed, or encapsulated in a single package 90. The electronic component 85 may optionally include a capacitor 5 encased, enclosed, or encapsulated in the single package 90, as will be described below. FIG. 11 shows a schematic diagram of electronic component 85, FIG. 12 shows opposite ends of a resistor 24 connected to leads 11 and 14 of the single package of electronic component 85, FIG. 13 is an exposed plan view of the electronic component 85, and FIG. 14 is a perspective view of the single package 90. The single package 90, illustrated in FIG. 14, is similar to package 10 in FIG. 5, but further includes an additional lead 14 which is electrically isolated from the package base 33. Alternatively, the package base 33 and case 34 could be replaced by a single conducting case, i.e., an electrically conductive structural portion, as in FIG. 6, which completely surrounds the enclosed transistors, in which case the source lead 11 is either electrically connected to or electrically isolated from the conducting case, and all other leads are electrically isolated from the conducting case. The requirements for the high-voltage depletion-mode transistor 23 and for the low-voltage enhancement-mode transistor 22 are the same as those previously described for electronic component 25.

The electronic devices encased or enclosed within the single package 90 in the electronic component 85 are mounted inside the single package 90 and connected as follows. Referring to FIG. 13, electrical connectors 92-97, which can be single or multiple wire bonds, are used to electrically connect portions of the single package 90, the low-voltage enhancement-mode (E-mode) transistor 22, the high-voltage depletion-mode (D-mode) transistor 23, and the capacitor 5 (when included) to one another. When III-N transistors with semi-insulating substrates are used for either or both the low-voltage E-mode transistor 22 or the high-voltage D-mode transistor 23, the low-voltage E-mode transistor 22 and/or the high-voltage D-mode transistor 23 can be mounted inside the package with their respective insulating or semi-insulating substrates in contact with the package base 23. When a capacitor 5 is included, the capacitor 5 can be mounted inside the package with a first electrode in contact with the package base 23. The source electrode 42 of the low-voltage E-mode transistor 22 is electrically connected to a conductive structural portion of the package such as the package base 33, for example by conductive connector 95, or can alternatively be electrically connected to source lead 11 of the package. In some implementations, the source electrode 42 of the low-voltage E-mode transistor 22 is electrically connected to a conductive structural portion of the package such as the package base 33, and the package does not include a source lead. In this case, the package may only include three leads; a gate lead 12, a drain lead 13, and an additional lead 14. The gate electrode 43 of the low-voltage E-mode transistor 22 is electrically connected to the gate lead 12 of the package, such as by conductive connector 94. The drain electrode 44 of the low-voltage E-mode transistor 22 is electrically connected to the source electrode 45 of the high-voltage D-mode transistor 23, such as by conductive connector 92. The drain electrode 47 of the high-voltage D-mode transistor 23 is electrically connected to drain lead 13 of the package, such as by conductive connector 96. The gate electrode 46 of the high-voltage D-mode transistor 23 is electrically connected to the additional lead 14 of the package, such as by conductive connector 93. The gate electrode 46 of the high-voltage D-mode transistor 23 is electrically connected to a lead of the single package, but is not electrically connected to any of the other electrodes of either transistor and in some implementations is not connected to any electrodes of any other transistors within the package (for example, when additional transistors are also included within the package). The second electrode of the capacitor is electrically connected to the gate electrode 46 of the high-voltage D-mode transistor 23, such as by conductive connector 97, or can alternatively be electrically connected to the additional lead 14 of the package.

As seen in FIG. 12, a resistor 24 can be at one end electrically connected to the additional lead 14 and at the other end electrically connected to source lead 11, which can limit the slew rate and reduce gate currents, similar to the advantages achieved by the resistor 24 in electronic component 25. In this implementation, a capacitor 5 is not included. Furthermore, in this implementation the user can choose the specific value of resistor 24 instead of being confined to the value of the pre-installed encapsulated resistor 24 as in electronic component 25, thereby allowing for greater flexibility in circuit design. However, including a resistor 24 within the package, as in FIG. 3, may be preferable in that parasitic inductances may be reduced, which can improve the circuit performance.

Figure 15:
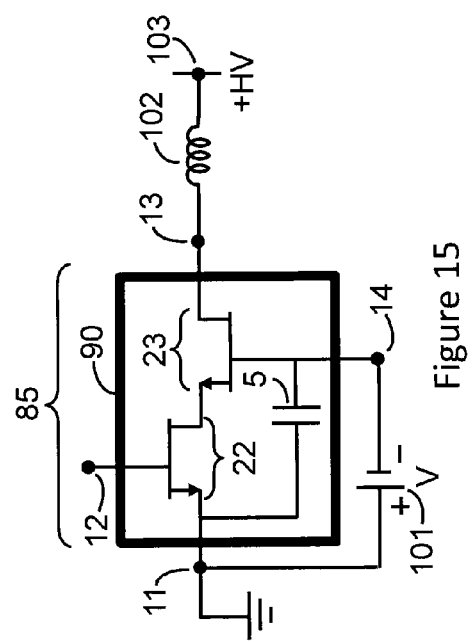
FIG. 15 is a schematic diagram of a circuit containing the electronic component of FIG. 11.
Figure 16:
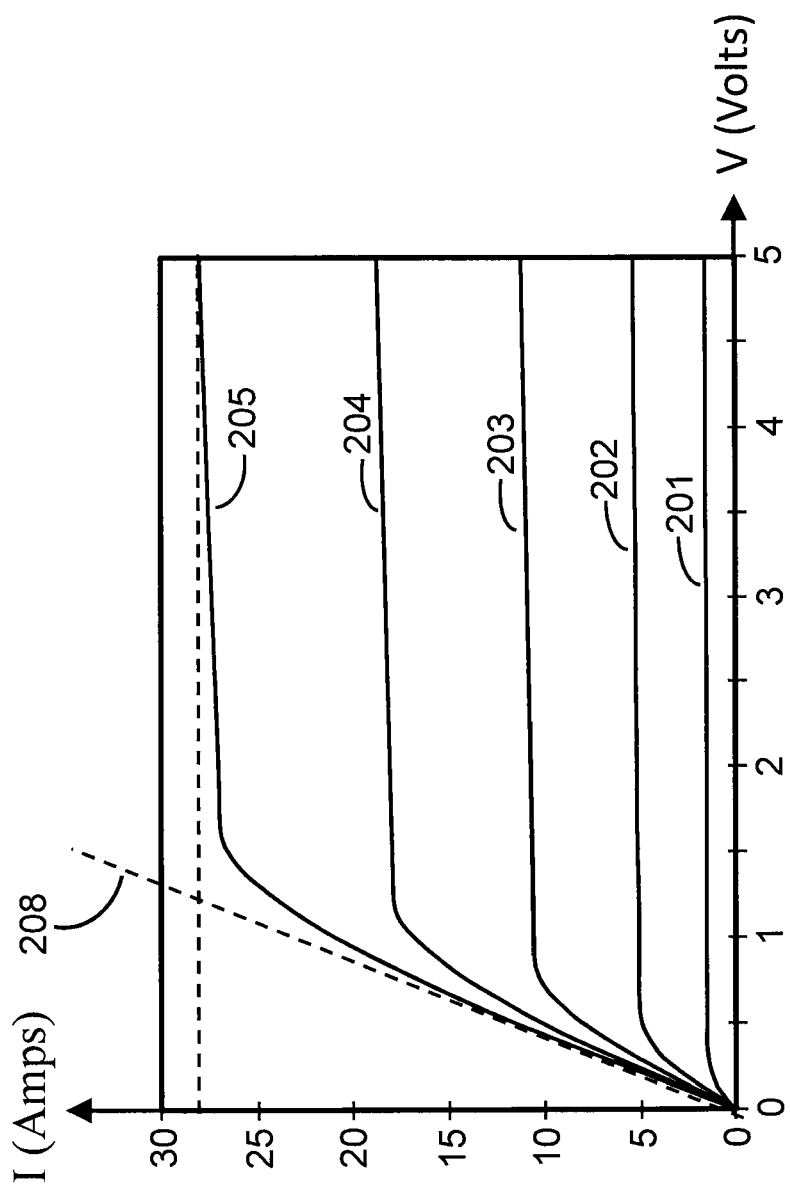
FIGS. 16 and 17 are plots of simulated I-V characteristics of the electronic component of FIG. 11.
Figure 17:
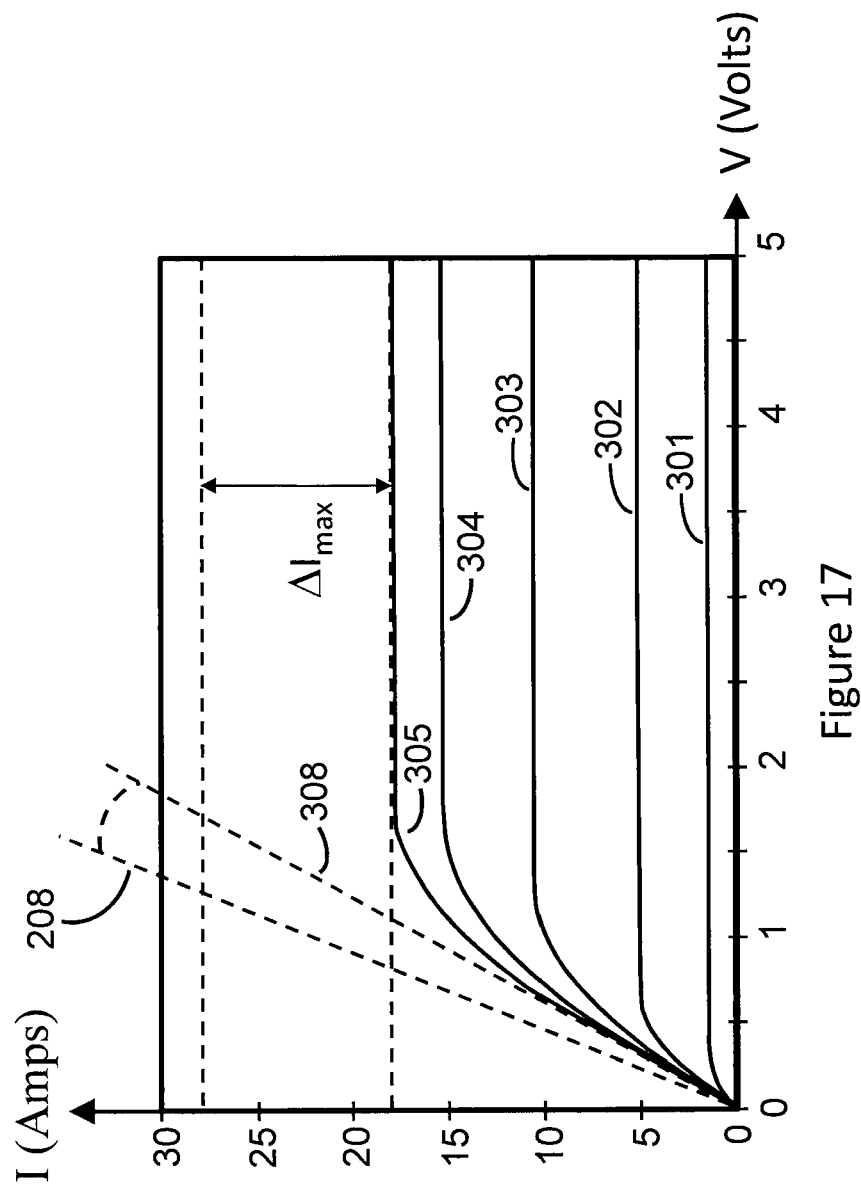

Electronic component 85 may further be operated as a current limiter to limit the current that can flow through the circuit in case of failure of the external circuit, such as short-circuiting of the load. This method of operation, which is achieved by applying a negative voltage to the additional lead 14 relative to the source lead 11, is illustrated in FIGS. 15-17. In conventional devices used for current limiting, the maximum current can generally only be reduced or limited at the expense of the on-state voltage, which is the voltage drop across the high-current terminals (drain to source, collector to emitter) while normal rated current is flowing. In other words, reducing the maximum current that can flow through a conventional device, either by modifying the device design or bias conditions, typically results in an increase in the device on-resistance or on-state voltage, which increases power loss during operation. A conventional device with a lower current limit will have a higher voltage drop in the on state, all other parameters being equal.

In electronic component 85, because the high-voltage D-mode transistor 23 provides the high-voltage blocking capability, it will normally have the larger contribution to the on-resistance of the composite device. That resistance, however, is often dominated by resistance of a drift region which provides the high-voltage capability, rather than the channel of the high-voltage D-mode transistor 23, which is directly modulated by the gate of the high-voltage D-mode transistor 23. Therefore, the gate of the high-voltage D-mode transistor 23 may be used to limit the maximum current without appreciably increasing the on-state resistance of the electronic component 85.

Referring to FIG. 15, when electronic component 85 drives a load 102, which can be an inductive load, source lead 11 can be connected to ground, drain lead 13 can be connected to one end of the load 102, and the opposite end of the load 102 can be connected to the circuit high voltage supply 103. The gate of the high-voltage D-mode transistor 23 can be held at a lower voltage than the source of the low-voltage E-mode transistor 22 by a voltage supply 101, which is at one end connected to source lead 11 and at an opposite end connected to additional lead 14. Alternatively, other methods can be used to maintain the voltage difference between source lead 11 and additional lead 14. For example, rather than using a voltage source to directly apply a negative voltage to the additional lead 14, a voltage divider circuit may be used to maintain the voltage difference between source lead 11 and additional lead 14. If the load 102 becomes a short circuit or becomes bypassed by a short circuit, which may for example occur during or after circuit failure, the maximum allowable current of the electronic component 85 will flow through the electronic component 85 and any other devices or components which are in series with the current path. The value of the voltage difference between the source and gate electrodes of the high-voltage D-mode transistor 23 directly controls the magnitude of this current. The more negative the voltage at the gate electrode relative to the source electrode, the smaller the maximum current that can flow. It can furthermore be advantageous to include capacitor 5 when electronic component 85 is operated as a current limiter in order to further stabilize the circuit.

The electronic component 85 is capable of limiting the maximum current with only a minimal increase in the on-state voltage drop or on resistance, as illustrated in FIGS. 16 and 17. FIG. 16 shows simulated current-voltage (I-V) characteristics for electronic component 85 when 0V is applied to lead 14 relative to lead 11, where the current I is the simulated current flowing into or out of drain lead 13, and the voltage V is applied between source lead 11 and drain lead 13. Each of the curves 201-205 corresponds to a different voltage $V_g$ applied to gate lead 12, where $V_g$ equals 2V for curve 201, 2.4V for curve 202, 2.8V for curve 203, 3.2V for curve 204, and 3.6V for curve 205. The on-resistance is determined by the slope of the I-V curve at small values of applied voltage V when the gate voltage $V_g$ is held high (such as 3.6V), i.e., the slope of line 208. More specifically, the on-resistance $R_{on}=1/$(slope of line 208). As seen in FIG. 16, when the electronic component is operated such that the gate voltage $V_g$ in the on state is 3.6V, the maximum current able to flow through the device is about 28 Amps and the on-resistance is about 0.043 Ohms. The simulated I-V characteristics of FIG. 17 are for the same component as those of FIG. 16, the only difference in the simulations being that now −4.5V is applied to lead 14 relative to lead 11. As seen, the maximum current able to flow through the device is about 18 Amps, or about 36% lower than in FIG. 16, while the on-resistance (given by the inverse of the slope of line 308) is only slightly higher than in FIG. 16.

One reason to limit the current in a circuit is to ensure that the electronic devices included in the circuit are not damaged in the event that one of the circuit components is short circuited for some amount of time. For example, referring to FIG. 15, if the load 102 becomes short circuited for some amount of time during circuit operation, the maximum current that is able to flow through electronic component 85 will flow for the duration of the time that electronic component 85 is short circuited. Reducing the maximum current increases the length of time that the maximum current can flow through electronic component 85 without damaging any of the electronic devices contained within the single package (i.e., increases the short-circuit survivability).

Figure 18:
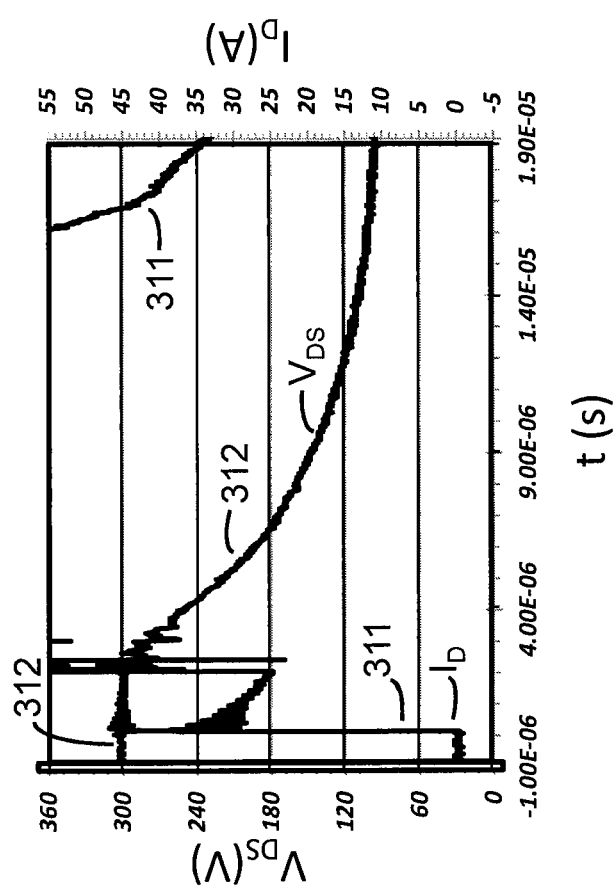
FIGS. 18 and 19 are plots of current and voltage characteristics of the circuit of FIG. 15.
Figure 19:
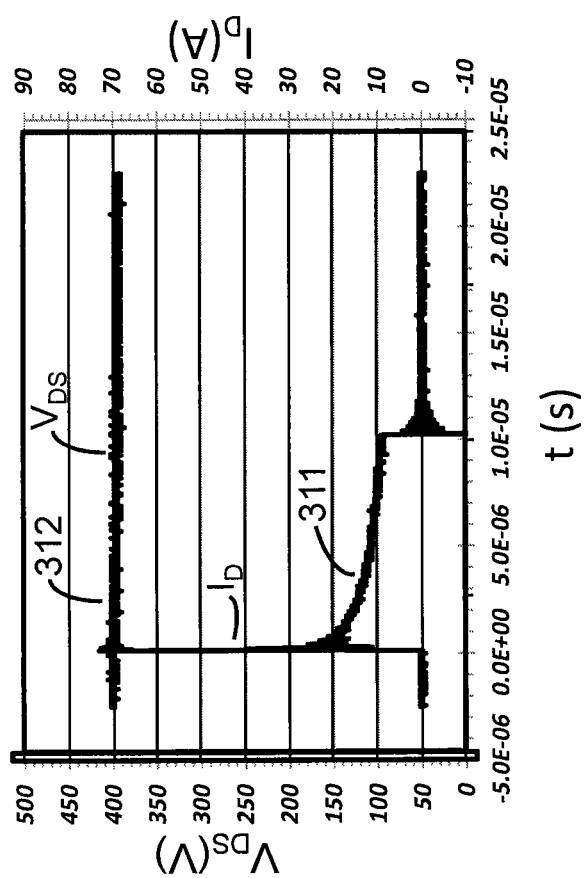

FIGS. 18 and 19 show measurements of the short-circuit survivability of electronic component 85 operated at different maximum currents (i.e., different voltages applied to lead 14 of the package). In FIG. 18, lead 14 was biased at 0V (grounded) and drain lead 13 was biased at 300V (the load 102 was omitted), while in FIG. 19, lead 14 was biased at −5V and drain lead 14 was biased at 400V (the load 102 was omitted). The negative voltage applied to lead 14 for the measurement in FIG. 19 results in a smaller maximum current for the measurement of FIG. 19 as compared to the measurement of FIG. 18. For both measurements, source lead 11 was grounded. In both measurements, the gate lead 12 was initially held at 0V, at time t=0 seconds was switched on (to a value greater than the threshold voltage of electronic component 85), and at time t=10 microseconds was switched back to 0V. As seen in FIG. 18, at time t=2 microseconds, the current 311 flowing through electronic component 85 drastically increased (the current level exceeded the axis limits of the plot) and the voltage 312 across the electronic component 85 began to drop, indicating that one or more of the devices in electronic component 85 were damaged. When the gate voltage was switched back to 0V at t=10 microseconds, substantial current 311 continued to flow, further indicative of damage to the devices. Hence the short-circuit survivability in FIG. 18 was about 2 microseconds for a source-drain voltage of 300V.

In FIG. 19, between t=0 and t=10 microseconds, the current 311 decreased monotonically and the voltage 312 across the electronic component 85 remained constant at 400V, indicating that the electronic component 85 was not damaged during this time and was operating properly. Furthermore, after the gate voltage was switched back to 0V at t=10 microseconds, the voltage 312 across the electronic component 85 remained constant at 400V and no substantial current 311 continued to flow through electronic component 85, indicating that the electronic component 85 was still not damaged and was operating properly. Hence the short-circuit survivability in FIG. 19 was at least 10 microseconds for a source-drain voltage of 400V. As such, when electronic component 85 is described as operated with a negative voltage applied to lead 14 relative to lead 11, as described above, the short-circuit survivability can be at least 10 microseconds for a source-drain voltage of at least about 300V or at least about 400V. In some implementations, the voltage applied to lead 14 is at least about 1V less than that applied to lead 11, at least about 3V less than that applied to lead 11, or at least about 5V less than that applied to lead 11.

A number of implementations have been described. Nevertheless, it will be understood that various modifications may be made without departing from the spirit and scope of the techniques and devices described herein. For example, when the high-voltage D-Mode transistor and the resistor of component 25 are integrated such that they share the same semiconductor materials, as in FIG. 8, the semiconductor materials do not need to be III-N materials, but can be formed of other materials, such as silicon, III-As, or III-P materials. The low-voltage E-mode transistor in electronic component 85, shown in FIG. 11, can be replaced by a bipolar transistor, such as an n-p-n bipolar transistor, when the electronic component 85 is used in current limiting applications. Accordingly, other implementations are within the scope of the following claims.

What is claimed is:

1. An electronic component, comprising:
   a depletion-mode transistor;
   an enhancement-mode transistor;
   a resistor; and
   a single package enclosing the depletion-mode transistor, the enhancement-mode transistor, and the resistor, the single package including
      a package base formed of an electrically conducting material,
      a source lead directly electrically connected to the package base, and
      a gate lead and a drain lead, each of which is electrically isolated from the package base,
   wherein the depletion-mode transistor, the enhancement-mode transistor, and the resistor are each provided on and supported by the package base,
   wherein a source electrode of the depletion-mode transistor is directly electrically connected to a drain electrode of the enhancement-mode transistor, and a drain electrode of the depletion-mode transistor is directly electrically connected to the drain lead, thereby causing the drain electrode of the depletion-mode transistor to be electrically isolated from the package base,
   wherein a first end of the resistor is directly electrically connected to a gate electrode of the depletion-mode transistor, and a second end of the resistor is directly electrically connected to the package base,
   wherein a gate electrode of the enhancement-mode transistor is directly electrically connected to the gate lead, thereby causing the gate electrode of the enhancement-mode transistor to be electrically isolated from the package base, and
   wherein a source electrode of the enhancement-mode transistor is directly electrically connected to the package base, thereby causing the source electrode of the enhancement-mode transistor and the second end of the resistor to be electrically connected to each other and to the source lead.

2. The electronic component of claim 1, wherein the depletion-mode transistor and the resistor are on a common substrate.

3. The electronic component of claim 2, wherein the depletion-mode transistor and the resistor comprise a same semiconductor layer structure.

4. The electronic component of claim 1, wherein the depletion-mode transistor and the resistor both comprise III-N semiconductor materials.

5. The electronic component of claim 1, wherein the depletion-mode transistor comprises a semiconductor layer structure, and the resistor comprises a conducting or semiconducting layer which is on the semiconductor layer structure.

6. The electronic component of claim 5, wherein the depletion-mode transistor is a III-Nitride transistor.

7. The electronic component of claim 1, wherein the resistor has a resistance of between about 100 Ohms and 100 kOhms.

8. The electronic component of claim 1, wherein the enhancement-mode transistor is a silicon-based transistor.

9. The electronic component of claim 1, wherein the enhancement-mode transistor is a III-Nitride transistor.

10. The electronic component of claim 1, wherein the depletion-mode transistor is a III-Nitride transistor.

11. The electronic component of claim 1, wherein the depletion-mode transistor is a high-voltage transistor, and the enhancement-mode transistor is a low-voltage transistor.

12. The electronic component of claim 1, wherein the resistor comprises a III-N semiconductor material including a two-dimensional electron gas, and the first and second ends of the resistor contact the two-dimensional electron gas.

13. The electronic component of claim 1, wherein the single package further comprises a case formed of an insulating material.

14. The electronic component of claim 13, wherein the single package includes a gate lead and a drain lead, the case includes a plurality of sides, and the gate lead and drain lead are on a first side of the plurality of sides.

* * * * *